United States Patent [19]

Ono et al.

[11] Patent Number: 4,554,204
[45] Date of Patent: Nov. 19, 1985

[54] FIBER REINFORCED RESIN MOLDED ARTICLES FOR ELECTROMAGNETIC WAVES AND METHOD FOR PRODUCTION THEREOF

[75] Inventors: Nobuhiro Ono; Eiji Miwa, both of Ueno, Japan

[73] Assignee: INAX Corporation, Tokoname, Japan

[21] Appl. No.: 548,236

[22] Filed: Nov. 3, 1983

[30] Foreign Application Priority Data

Nov. 6, 1982 [JP] Japan .................................. 57-194899

[51] Int. Cl.$^4$ ............................ B32B 7/00; B29D 3/02
[52] U.S. Cl. ...................................... 428/246; 264/1.9; 264/108; 264/113; 264/258
[58] Field of Search ............... 264/108, 109, 112, 113, 264/258, 1.9; 428/242, 246

[56] References Cited

U.S. PATENT DOCUMENTS

| | | | |
|---|---|---|---|
| 3,112,221 | 11/1963 | Price | 428/242 |
| 3,445,320 | 5/1969 | Boivin | 428/242 |
| 3,591,400 | 7/1971 | Palmquist et al. | 428/242 |
| 4,243,460 | 1/1981 | Nagler | 428/242 |
| 4,269,800 | 5/1981 | Sommer et al. | 264/113 |
| 4,373,001 | 2/1983 | Smith et al. | 428/246 |
| 4,402,779 | 9/1983 | Levy | 264/258 |

*Primary Examiner*—Donald Czaja
*Assistant Examiner*—V. Fischbach
*Attorney, Agent, or Firm*—Browdy and Neimark

[57] ABSTRACT

There is provided an FRP molded article having the properties of uniformly reflecting and shielding electromagnetic waves in the range of VHF to EHF. The molded article comprises a compression-molded laminated structure composed of an electroconductive nonwoven fabric-resin composite surface layer, a woven fabric-resin composite intermediate layer, and a fiber material reinforced resin substrate layer. The molded article can be produced by placing, on a mold, an electroconductive nonwoven fabric or a prepreg thereof, a woven fabric or a prepreg thereof, and then a mixture of a reinforcing fiber material and a liquid crosslink-curable resin composition thereon, and subjecting the laminated materials to compression molding. The molded articles can be advantageously used, for example, as reflecting dish antennas as well as shielding sheets or boards for electromagnetic waves.

22 Claims, 3 Drawing Figures

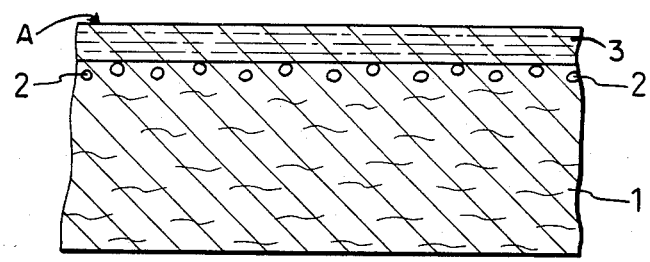
FIG. 1
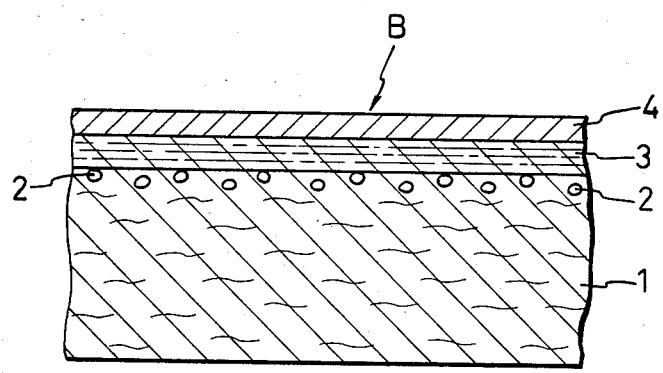
FIG. 2
FIG. 3
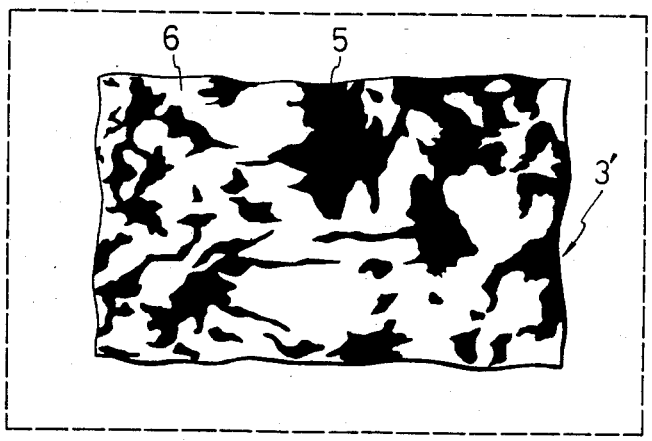

FIBER REINFORCED RESIN MOLDED ARTICLES FOR ELECTROMAGNETIC WAVES AND METHOD FOR PRODUCTION THEREOF

BACKGROUND OF THE INVENTION (i) Field of the Invention

This invention relates to a fiber reinforced resin molded article for electromagnetic waves. More particularly, this invention relates to a fiber reinforced resin (hereinafter sometimes referred to as FRP) molded article which contains an electroconductive nonwoven fabric-resin composite layer having a flat or curved surface and provides the properties of uniformly reflecting and shielding VHF or shorter electromagnetic waves, and to a method for production thereof. Some molded articles of the present invention are especially useful as antennas for receiving or transmitting electromagnetic waves in the range of VHF to EHF.

(ii) Description of the Prior Art

Hitherto, for providing resin molded articles with electromagnetic wave-reflecting properties (hereinafter referred to as EMWR properties) or electromagnetic wave-shielding properties (hereinafter referred to as EMWS properties or EMI shielding properties), there have been conducted coating of substrate articles with electroconductive paints; application of metallic materials on the substrate articles by means of flame spraying, chemical plating, vapor deposition, sputtering, or ion-plating; addition of electroconductive fillers, metal foils, metal fibers, metal ribbons or metal flakes to the molding resins; and the like. The application of these materials to thermo-setting resin articles, however, had some troubles with respect to performances, stability, costs and/or processability of the resulting products. For example, coating with electroconductive paints caused oxidative deterioration, formation of cracking and peeling, etc. The flame spraying of metals required a large apparatus with high cost, needed a pre-treatment step, and also caused toxic metal vapors. In the chemical plating, the plastics to be plated are restricted to ABS resin and some other similar resins, and also a costly apparatus is required.

In the case of a parabola antenna for reflecting electromagnetic waves, such antennas of metal (normally of aluminum) have been fabricated carefully with high cost and can hardly be repaired when the reflective surface thereof was once damaged.

In the case of a parabola antenna made of FRP, the reflective surface thereof having uniformly electroconductive surface is required in order to obtain necessary performances. In this connection, it has been considered that an electroconductive nonwoven fabric can not be used successfully for the above mentioned purpose in a compression molding method, because the fibers of the nonwoven fabrics are moved or broken by the molding pressure and ununiform flow of a resin component, etc. and an ununiform reflective surface is produced. Thus, an FRP plate having the EMWR or EMWS properties, wherein a sheet molding compound containing a large amount of an electroconductive short fiber is used instead of the nonwoven fabric, has been produced by compression molding. The performance of this FRP plate containing such short fiber and no nonwoven fabric, however, is unstable because the electroconductive short fiber is dispersed ununiformly throughout the FRP body by the compression molding step to give an ununiform reflective surface. See, for example, CONDUCTIVE POLYMER (1981), pages 49–55, Plenum Publishing Corporation, New York. Even when an extremely large amount of the short fiber and resin materials are used regardless of high costs, the resulting FRP plate contains a very thick, ununiformly dispersed electroconductive layer which may fail to exhibit uniformly reflecting properties.

A hand lay-up molding method has problems in both precise surface characteristics and productivity. An injection molding method suffers from precise surface characteristics of the resulting product. Such inferior surface characteristics as waviness on the surface caused by shrinkage upon hardening of resin materials have adverse effects on reflective loss of electromagnetic waves and reflecting properties as well as on antenna performances.

SUMMARY OF THE INVENTION

An object of the present invention is to provide an FRP molded article for electromagnetic waves having the properties of uniformly reflecting and shielding VHF or shorter electromagnetic waves, and a method for production thereof. Another object of the present invention is to provide the above mentioned molded article onto the surface of which a protective and/or decorative resin layer is further applied, and a method for production thereof. A further object of the present invention is to provide antennas (e.g., of a parabolic shape) composed of the molded article having a curved, e.g. concave, reflective surface for receiving or transmitting electromagnetic waves. Other objects and features of the present invention will become apparent from the following description.

Thus in accordance with the present invention, there is provided an FRP molded article for electromagnetic waves having the properties of uniformly reflecting and shielding electromagnetic waves, which comprises or consists essentially of a compression-molded crosslink-cured resin-fiber material laminated structure having a plane or curved reflective surface composed of a surface layer, an intermediate layer and a substrate layer; said surface layer being an electroconductive nonwoven fabric-cured resin composite layer having an effective layer thickness of at least about 0.005 mm; said intermediate layer being a woven fabric-cured resin composite layer having an effective layer thickness of at least about 0.005 mm, said fabric having a mesh size of not larger than about 5 mesh; and said substrate layer being an FRP layer. As necessary, there is also provided the above mentioned molded article having a top protective and/or decorative resin layer on the nonwoven fabric-resin composite layer. The top resin layer may contain pigment.

The above mentioned molded article for electromagnetic waves of the present invention can be advantageously produced according to the present method for production which comprises steps of placing, on a mold having a desired molding surface, an effective amount of an electroconductive nonwoven fabric for the surface layer and then an effective amount of a woven fabric for the intermediate layer, the non-woven fabric and/or the woven fabric of which may be impregnated (e.g. in the form of a prepreg) with a liquid crosslink-curable resin composition or may not; placing thereon a mixture of a reinforcing fiber material and a liquid crosslink-curable resin composition for the substrate layer, the compound viscosity of the resin composition being not more than about $5 \times 10^8$ cps; and then compressing the laminated materials under a molding pressure of about 25 to about 100 kgf/cm$^2$ and at a mold closing speed of not more than about 240 mm/minute and curing the resin composition; whereby the flow of the liquid resin composition into the nonwoven fabric layer in the course of compression is substantially controlled in such a direction that the liquid resin composition passes through the interstices of the woven fabric to prevent the nonwoven fabric from ununiformly dispersing and/or fracturing. The above mentioned protective and/or decorative surface resin layer can be provided either by applying the top resin layer onto the molded article or by applying a resin material onto a molding surface of the mold and then molding the article.

Incidentally, the liquid crosslink-curable resin composition to be used in the present invention normally comprises a crosslinkable resin, a copolymerizable monomer or a compound for addition polymerization, and preferably a hardening agent such as a catalyst, which may further contain a thickener such as magnesium oxide, a releasing agent and an optional component such as fillers. This resin composition is generally referred to as "compound". The term "compound viscosity" herein means the viscosity of such a resin composition measured by means of a B-type Helipath viscometer supplied by Brookfield Engineering Laboratories, U.S.A.

Incidentally, the term "mesh" herein means the number of openings per linear inch of the woven fabric.

BRIEF DESCRIPTION OF THE DRAWINGS

FIG. 1 is a schematic cross-sectional view of the molded article consisting of surface, intermediate and substrate layers according to the present invention.

FIG. 2 is a schematic cross-sectional view of the present molded article having a protective and/or decorative top resin layer thereon.

FIG. 3 is a schematic plane view showing a fractured nonwoven fabric according to a comparative example 4 herein.

DETAILED DESCRIPTION OF THE INVENTION

The term "the molded article having properties of uniformly reflecting and shielding electromagnetic waves" used herein means that the molded article has a substantially smooth reflective surface for electromagnetic waves, has the property of regularly reflecting electromagnetic waves without forming phase difference such as phase lag of the waves in a predetermined direction, and also has the property of preventing penetration of electromagnetic waves therethrough without substantially irregular reflection of the waves. Thus, the molded article according to the present invention can be advantageously used, by utilizing its uniformly reflecting property, as a curved or plane reflecting sheet or board for electromagnetic waves such as reflecting antennas as well as a plane or curved shielding sheet or board which does not cause irregular reflection of electromagnetic waves in an undesirable direction. The present molded articles for electromagnetic waves are useful for electromagnetic waves in the range of VHF to EHF, and especially useful for electromagnetic waves having a wave length of about 100 MHz to about 100 GHz but are not always restricted to such a wave length.

The electroconductive nonwoven fabric mentioned above means a nonwoven fabric of inorganic, metallic or organic fibers generally having electroconductivity, preferably of at least about $1 \times 10^3$ ohm$^{-1}$cm$^{-1}$. The fibers of the nonwoven fabric include, for example, metal fibers, carbon fibers, inorganic or organic fibers surface-coated fully or partly with a metal (e.g. with about 5 to about 50% by weight of metal), electroconductive synthetic fibers and mixtures thereof, which are generally commercially available. The nonwoven fabric of metal-coated glass fibers is normally employed. The diameter of the electroconductive fibers is preferably as small as possible for the EMWR and EMWS performances, and is generally less than about 30 microns in diameter. The above mentioned metal is exemplified by aluminum, nickel, silver, copper, zinc, an alloy thereof, and the like. Incidentally, the nonwoven fabric may contain some non-electroconductive fibers unless the electroconductivity is not substantially impaired.

The amount of the electroconductive nonwoven fabric to be used is required to be as dense as to prevent penetration of electromagnetic waves therethrough. The nonwoven fabric-resin composite layer should have an effective layer thickness of at least about 0.005 mm. The upper limit of the amount thereof to be used is not especially restricted, but the larger amount is uneconomical. When the nonwoven fabric is not impregnated with the liquid resin composition in advance, the amount of the nonwoven fabric to be used is such that the resin composition can permeate into the fabric satisfactorily in the course of compression molding. Thus, the thickness of the nonwoven fabric-resin layer is generally in the range of about 0.005 to about 1 mm and typically in the range of about 0.01 to about 0.2 mm. In this connection, the thickness of nonwoven fabric materials to be used prior to compression molding will be approximately in the range of 0.01 to 3 mm when not impregnated with the resin composition and in the range of 0.01 to 2 mm when impregnated. For example, such thickness corresponds to about 25 to about 900 g/m$^2$ and preferably 50 to 300 g/m$^2$ in the case of a metal-coated glass fiber nonwoven fabric and to about 25 to about 400 g/m$^2$ and preferably 30 to 200 g/m$^2$ in the case of a carbon fiber nonwoven fabric. These are referred to as an effective layer thickness and an effective amount herein, respectively.

Incidentally, when the electroconductive nonwoven layer is replaced by an electroconductive woven fabric, the satisfactory properties of uniformly reflecting and shielding electromagnetic waves can hardly be obtained presumably because of uneven surface of the woven fabric, interstices of the woven fabric, and the like.

The woven fabric for the intermediate layer is to control the flow of the liquid resin composition into the nonwoven fabric layer in the course of compression molding for preventing the nonwoven fabric from un-uniform dispersion, waviness and/or fracture. In other words, the intermediate woven fabric layer is to control the flow of the resin composition in such a direction that the liquid composition passes through the interstices of the woven fabric and to prevent the liquid composition from flowing substantially laterally along the nonwoven fabric. Thus, it is required that the woven fabric has such thickness (molded thickness of at least about 0.005 mm) and strength (e.g. tensile strength of at least about 16 kgf/inch) as to control the above mentioned flow of the liquid resin composition. It is desired that the woven fabric has the interstices having a mesh size of smaller than about 10 mesh and preferably smaller than about 16 mesh, because when the interstice is too coarse the above mentioned control of the flow becomes difficult. The mesh size, however, should not be so small as to impede the flow of the liquid composition. Incidentally, the woven fabric should preferably have some flexibility so that it can compress the nonwoven fabric uniformly. There can be used ordinary inorganic, organic or metallic woven fabrics having the above mentioned mesh sizes which produce the intermediate layer having molded thickness in the range of generally about 0.005 to about 2 mm and typically about 0.01 to about 1 mm. In this connection, the thickness of the woven fabric materials to be used prior to compression molding will be approximately in the range of 0.01 to 2 mm. For example, such thickness generally corresponds to about 25 to about 400 g/m$^2$ and preferably 60 to 200 g/m$^2$ in the case of ordinary woven fabrics. These are referred to as an effective layer thickness and an effective amount herein, respectively. Incidentally, such woven fabrics have a thread count of generally 11 to 60 and typically 19 to 40 threads/25 mm.

There can be used reinforcing fiber materials of inorganic, organic or metallic substance mixed or impregnated with a liquid crosslinkable resin composition for the above mentioned substrate layer. The fiber materials may be in the form of short fibers, bulky fibers, nonwoven fabrics, woven fabrics having coarse interstices or mixtures thereof, although low-cost short fibers can be generally used with satisfactory results. Normally, a so-called sheet molding compound or bulk molding compound, hereinafter referred to as SMC or BMC, can be used advantageously. Incidentally, the SMC means glass fiber chopped to about 1 inch, impregnated with a crosslinkable resin composition and stored in the form of sheet. The BMC means glass fiber chopped to about $\frac{1}{4}$–$\frac{1}{2}$ inch, impregnated with a crosslinkable resin composition and stored in the form of bulk. The amount to be used of the fiber material impregnated with the resin composition is such as to provide the present molded article with satisfactory strength. The amount to be used is, for example, such as to get the molded thickness of the substrate layer of at least about 1.0 mm. The upper limit thereof will depend on the dimensions of the molded article, which will be readily selected by those skilled in the art. In general, the amount of the fiber material impregnated with the resin composition to be used for the substrate layer will be such as to get the molded thickness of the substrate layer in the range of about 1 to about 10 mm. As necessary, the molded thickness of the substrate layer can be larger than about 10 mm.

The crosslinkable resin to be used in the present invention means a resin component which can form a crosslink-cured resin by application thereto of heat (e.g. about 80° to about 200° C.), a catalyst and/or a high-energy ionizing radiation (e.g. gamma rays, electron beams, etc.). The crosslinkable resins encompass (i) an ethylenically unsaturated resin containing a multiplicity of ethylenical double bonds which is substantially dissolved in an ethylenically unsaturated monomer, (ii) an addition-polymerizable multifunctional resin and a compound for addition polymerization such as acid anhydrides, alcohols, amines or mercaptans, and the like.

The ethylenically unsaturated resins include, for example, an unsaturated polyester resin, an allyl resin such as diallyl phthalate polymers, a pendant-type unsaturated resin such as vinyl ester resins, and mixtures thereof. The reactive unsaturated monomers to substantially dissolve these resins include, for example, vinyl monomers such as styrene monomers, acrylonitrile, vinyl acetate and acrylic monomers; allyl monomers such as diallyl phthalate, and mixtures thereof. The ratio of the resins to the monomers to be used is generally in the range of about 80/20 to about 40/60 by weight. The polymerization agents therefor are exemplified by a radical polymerization catalyst such as organic peroxides, a redox catalyst and, if used, a polymerization accelerator such as organic amines, mercaptans or metal naphthenate.

The addition-polymerizable multifunctional resins include, for example, an epoxy resin such as glycidyl epoxide resins, which are used together with a substantially stoichiometric amount of a compound for addition polymerization such as acid anhydrides.

The above mentioned crosslink-curable resins, polymerization catalysts, polymerization accelerators, compounds for addition polymerization are well known and can be readily selected by those skilled in the art. Incidentally, the above mentioned polymerization catalyst and accelerator can be normally used in effective amounts of less than about 2% by weight of the liquid crosslinkable resin, respectively. The dose of the ionizing radiation, if used, is generally in the range of about $10^3$ to about $10^7$ rads. The period for compression molding will be generally about 3 to about 20 minutes.

Because the dimensional stability and the like are especially important for the present molded article, it is preferred to use a suitable thermoplastic resin in the form of a solution or suspension as an anti-shrinkage agent as a mixture with the crosslinkable resin, the ratio of the liquid thermoplastic resin to the liquid crosslinkable resin being generally about 35/65 to about 5/95 by weight. These anti-shrinkage thermoplastic resins include, for example, a polymer or copolymer of one or more monomers selected from styrene, vinyl acetate, an acrylate, a methacrylate, caprolactone, ethylene, etc., and mixtures thereof. These thermoplastic resins are normally used in the form of a solution or suspension in an ethylenically unsaturated monomer such as a vinyl monomer.

When a protective or decorative resin layer is applied onto the electroconductive nonwoven fabric layer of the present molded article, the thickness of the top resin layer is generally in the range of about 0.015 to about 0.3 mm. Such resin layer can be produced by coating with a resin paint, flame coating or electrostatic coating with resin powder, etc. on the molded article or by application of a resin surfacing agent onto the surface of a mold prior to compression molding. These are well known in the art.

The process for producing the molded article in accordance with the present invention comprises carrying out compression molding of the laminated materials in a mold at a molding pressure of about 25 to about 100 kgf/cm$^2$ and at a mold closing speed of not more than 240 mm/minute and preferably not more than about 120 mm/minute. Ununiform dispersion and fracture of the nonwoven fabric may take place if the molding pressure or mold closing speed is over the above defined ranges. The molding process, which satisfies the above mentioned conditions, is easily understood by those skilled in the art and can be readily carried out by means of conventional compression molding machines. For example, a matched-die molding machine can be advantageously used for efficient production of the molded articles. Incidentally, in the present molding process, means such as nuts and bolts for installation of antenna equipment and/or supporting members can be readily embedded in the molded articles.

The typical embodiments of the present invention will be further explained with reference to attached drawings as necessary. It is to be understood that the present invention should not be restricted by these examples. Incidentally, the amounts and percentages used herein are by weight unless otherwise specified.

The molded article A in FIG. 1 shows a molded FRP sheet having laminated structure for uniformly reflecting or shielding electromagnetic waves, consisting of an FRP substrate layer 1, a woven fabric composite intermediate layer 2 formed on the substrate layer 1, and an electroconductive surface layer 3, consisting of an electroconductive nonwoven fabric-resin composite, formed on the intermediate layer 2. The molded article B in FIG. 2 shows a molded FRP sheet for uniformly reflecting and shielding electromagnetic waves, consisting of the above mentioned article A and a protective or decorative top resin layer 4 formed on the electroconductive surface layer 3. It should be noted that, in the present molded articles as shown in FIGS. 1 and 2, the layers 1 and 2 and especially the electroconductive layer 3 have the distinct laminated layer structure by the presence of the woven fabric intermediate layer 2.

The molded article A can be produced, for example, by placing an electroconductive nonwoven fabric (25 to 900 g/m$^2$ in the case of a metal-coated glass fiber nonwoven fabric) on a mold, placing thereon a woven fabric having dimensions of 95% or more of an electroconductive-layer area required, and further either (i) placing thereon an SMC or BMC having compound viscosity of not more than $5 \times 10^8$ cps to cover 50% or more of the area of the article to be molded or (ii) pouring thereon a high viscosity crosslink-curable resin composition containig a reinforcing fiber material, and then heating under compression in a prewarmed mold at a curing temperature (e.g. lower than about 160° C.), a molding pressure of 25 to 100 kgf/cm$^2$ and a mold closing speed of not more than 240 mm/minute.

In order to produce the molded article B having a top resin layer 4 on the electroconductive layer 3, the top resin layer can be applied either by coating it on the electroconductive layer of the molded article A or by coating it on the surface of a mold prior to the compression molding (i.e. so-called in-mold coating). In the case of the in-mold coating, a resin surfacing agent comprising polyester resin, acrylic resin, urethane resin or the like is applied by means of electrostatic powder coating onto a mold which has been preheated to a temperature as high as a molding temperature of the SMC or BMC, and then the above mentioned compression molding is carried out. Such top resin layer can also be applied onto the substrate layer if so desired. More specifically, the thickness of the top layer 4 is generally in the range of 0.05 to about 0.3 mm. The material thereof consists essentially of, for example, polyester resin and toluidine isocyanate and/or diallyl phthalate, etc. Incidentally, the top layer 4 plays a role of protecting the electroconductive layer, preventing mar thereon and increasing weathering properties, as well as enhancing attractive appearance and coloring.

In the following examples, a solution of an unsaturated polyester resin in styrene monomer was used as a main component of the liquid crosslink-curable resin composition. The highly reactive polyester resin is produced from 1 mol isophthalic anhydride, 3 mols maleic anhydride and 4.5 mols propyrene glycol, and has one double bond per molecular weight of about 300. Similar unsaturated polyester resin is exemplified by "Polymar 6819" of Takeda Yakuhin Kogyo K.K., Japan. About 60% of the unsaturated polyester resin was dissolved in about 40% of styrene monomer to adjust its viscosity to about 10 poises (25° C.). As an anti-shrinkage agent, was used a solution of about 30% of polystyrene (Dialex HF-77 from Mitsubishi Monsanto K.K., Japan) dissolved in about 70% of styrene monomer. Incidentally, the mixing ratio of the crosslinkable resin solution to the anti-shrinkage resin solution is normally in the range of about 70/30 to about 90/10.

EXAMPLE 1

There was used an SMC for the substrate layer 1 composed of 50 parts of 1 inch glass fiber and a liquid crosslinkable resin composition consisting essentially of 75 parts of the above mentioned unsaturated polyester solution, 25 parts of the above mentioned anti-shrinkage polystyrene resin solution, 100 parts of calcium carbonate, 1 part of t-butyl perbenzoate polymerization catalyst, 6 parts of zinc stearate releasing agent and 2 parts of magnesium oxide thickener. As the material for the woven fabric layer 2 was used a plain weave fabric of glass fiber 120 g/m$^2$ having a mesh size of about 20 mesh. As the material for the electroconductive layer 3 was used as a prepreg consisting of a 500 g/m$^2$ nonwoven fabric of glass fiber coated with 25% by weight of aluminum and the above mentioned liquid crosslinkable resin composition. The materials for the electroconductive layer, the woven fabric layer and the substrate layer were placed on a mold in this order and subjected to compression molding under the conditions shown in the Table below. There was thus obtained a plane FRP molded sheet 1 m × 1 m × 6 mm. Neither waviness nor fracture of the nonwoven fabric in the electroconductive layer 3 was observed with respect to the resulting molded sheet. The reflection loss of the resulting molded sheet was found to be a very small value of 0.2 dB or less when 12 GHz electromagnetic wave was used.

EXAMPLE 2

The process of Example 1 was repeated except that the viscosity of the liquid crosslinkable resin composition, the molding pressure and the mold closing speed were changed as shown in the table below. There was thus obtained a plane FRP molded sheet 1 m × 1 m × 3 mm. Neither waviness nor fracture of the nonwoven fabric layer was observed. The reflection loss was as small as 0.2 dB or less.

EXAMPLE 3

The process of Example 1 was repeated except that there was used a mold having a molding surface of a convex paraboloid of revolution. There was thus obtained a molded FRP sheet with a shape of the corresponding concave paraboloid of revolution which has the dimensions of 600 mm diameter and 6 mm thickness and also has the surface of a concave paraboloid of revolution represented by an expression of $y^2 + z^2 = 4.Fd.x$ wherein Fd (focal distance) is 360 mm. Neither waviness nor fracture of the nonwoven fabric was observed. The gain with the resulting molded sheet used as a parabola antenna was 37 dB.

EXAMPLE 4 (COMPARATIVE)

The process of Example 1 was repeated except that the woven fabric for the layer 2 was not used to obtain a plane FRP sheet. The nonwoven fabric of the resulting molded sheet was fractured and ununiformly dispersed to form about 50% by area of non-electroconductive portions. The fractured nonwoven fabric 5 and the space 6, where the nonwoven fabric is absent, of the resulting nowoven fabric layer 3' are schematically shown in FIG. 3.

EXAMPLE 5 (COMPARATIVE)

A plane molded FRP sheet 1 m×1 m×3 mm was produced in a process similar to that of Example 1 except that a prepreg of 120 g/m$^2$ glass fiber woven fabric was used for the woven fabric layer and the molding was carried out as shown in Table below by a hand lay-up method instead of a compression molding. The results are summarized below.

EXAMPLE 6 (COMPARATIVE)

The process of Example 1 was repeated except that the 120 g/m$^2$ woven fabric for the intermediate layer was not used, and a prepreg consisting of a 860 g/m$^2$ glass fiber woven fabric having a coarse mesh size of about 3 mm square and the above mentioned liquid crosslinkable resin composition was used instead of the SMC for the substrate layer. Some uneven thickness was observed in the electroconductive layer of the resulting FRP sheet. Moreover, about 30% by area of non-electroconductive portions were formed on the resulting electroconductive layer.

The conditions used and the results of the above described Examples are summarized in the following.

TABLE

| Ex. Nos. | nonwoven fabric of electroconductive layer, g/m$^2$ | molding pressure kgf/cm$^2$ | viscosity of liquid resin composition cps | mold closing speed mm/minute | molding temperature °C. | molding time, minute |
|---|---|---|---|---|---|---|
| Ex. 1 | 500 | 40 | 5 × 10$^6$ | 50 | 140 | 4 |
| Ex. 2 | 250 | 80 | 5 × 10$^7$ | 100 | 150 | 3 |
| Ex. 3 | 500 | 40 | 5 × 10$^6$ | 50 | 140 | 4 |
| Ex. 4 | 500 | 40 | 5 × 10$^6$ | 50 | 140 | 4 |
| Ex. 5 | 500 | 0 | 1 × 10$^3$ | 0 | 40 | 240 |
| Ex. 6 | 500 | 40 | 5 × 10$^5$ | 50 | 140 | 6 |

As clear from the Examples, both the uneven thickness and surface waviness of the electroconductive layers were generated in Examples 4 through 6. In Examples 4 and 6, the electroconductive nonwoven fabrics were dispersed and ununiformly distributed by the action of ununiform flow of the liquid resin composition, and considerable non-electroconductive portions were formed in the electroconductive layers. The defects have seriously adverse effects on the inaccuracy of reflective mirror surface and thus on antenna performances. The above mentioned defects observed in Comparative Examples 4 through 6 were not found at all in Examples 1 through 3 of the present invention. It is to be noted that these defects have been eliminated by the use of the woven fabric as the intermediate layer 2, whereby the electroconductive layer 3 having uniform layer structure can be securely formed.

Incidentally, the electromagnetic wave-reflecting performances were measured in the following way by using 12×10$^9$ Hz (i.e. 12 GHz) electromagnetic wave. For the molded article having a parabolic reflective surface, the electromagnetic wave-reflecting performance thereof is determined in accordance with Japanese Industrial Standard (JIS) C 6103 "Testing method for a television antenna". For the molded article having a plane reflective surface, the reflecting performance is determined by an apparatus wherein a horn-type antenna for generating and receiving an electromagnetic wave is equipped in horizontal direction and a reflecting palte (30×30 cm) is set vertically and in a fashion movable horizontally. Thus, the reflection loss is obtained from the resulting reflection in comparison with that of an polished aluminum plate (the loss of which is evaluated as 0 dB).

In the latter testing method, when the reflection loss is 0.2 dB or less, it can be understood by those skilled in the art that the gain to be obtained by using the present molded article as such an offset-type parabola antenna as given in JIS C6103 is as follows:

| diameter of parabora antennas, m.m. | gain with 12 GHz electromagnetic wave |
|---|---|
| 600 | 35 dB or more |
| 750 | 37 dB or more |
| 900 | 39 dB or more |
| 1,000 | 40 dB or more |
| 1,200 | 41 dB or more |

These gain values are quite satisfactory for practical uses.

The preferable conditions in the process for production of the present molded articles are given below. (1) The SMC has been normally cured to B-stage. It is necessary that the compound viscosity of the liquid resin composition thereof containing no reinforcing fiber is not more than 5×10$^8$ cps. It is especially preferred that the compound viscosity is in the range of 5×10$^6$ to 5×10$^7$ cps. (2) It is preferred that the molding pressure is in the range of 40 to 80 kgf/cm$^2$. (3) It is preferred that the mold closing speed is in the range of 50 to 200 mm/minute. (4) The dimensions of an electroconductive nonwoven fabric or a prepreg thereof to be placed on a mold should be as large as to be about 100% of a required electroconductive area. In the same way, the dimensions of an woven fabric or a prepreg thereof for the intermediate layer should be preferably as large as to be about 100% of the required electroconductive area. (5) The dimensions of SMC or BMC to be placed on the woven fabric layer material should be preferably about 50% to about 90% of the mold area.

Incidentally, the lamination of these materials for the surface layer, the intermediate layer and the substrate layer prior to compression molding can be conducted either in the mold or outside of the mold.

As described above in detail, the molded articles according to the present invention provide a high-precision molded FRP sheet or board for uniformly reflecting and shielding electromagnetic waves. For example, there are thus provided a parabola antenna or an offset-type parabola antenna having very excellent performances. A molded article having very small inaccuracy of reflective mirror surface can be obtained, because the electroconductive layer can be uniformly formed in a single layer and the electroconductive region is not distributed throughout a molded article as observed in such conventional FRP products. Moreover, the cost, processability, precision of the product, use life, productivity and the like of the present molded articles have been markedly improved in comparison with those of conventional products and processes for production thereof.

What is claimed is:

1. A fiber reinforced resin molded article for electromagnetic waves having the properties of uniformly reflecting and shielding electromagnetic waves in the range of VHF to EHF, which comprises a compression-molded crosslink-cured laminated structure, having a plane or curved reflective surface, consisting essentially of a surface layer, an intermediate layer adjacent to said surface layer and a substrate layer; said surface layer being an electroconductive nonwoven fabric-cured resin composite layer having an effective layer thickness of at least about 0.005 mm; said intermediate layer being a woven fabric-cured resin composite layer having an effective layer thickness of at least about 0.005 mm, said woven fabric having a mesh size of not larger than about 5 mesh; and said substrate layer being a fiber material reinforced resin layer.

2. The molded article according to claim 1, in which the fiber of the nonwoven fabric is selected from the group consisting of a metal fiber, a carbon fiber, a metal-coated fiber, an electroconductive synthetic fiber, and mixtures thereof.

3. The molded article according to claim 1, in which the cured resin of the molded article contains a crosslink-cured resin and a thermoplastic resin used as an anti-shrinkage agent.

4. The molded article according to claim 1, which is a parabola antenna for electromagnetic waves, the surface of the electroconductive nonwoven fabric layer being substantially a concave paraboloid of revolution.

5. The molded article according to claim 1, which is an electromagnetic wave-shielding sheet or board preventing penetration of the waves therethrough without substantially irregular reflection.

6. The molded article according to claim 1, in which the article has a thin top resin layer on the surface electroconductive layer.

7. The molded article according to claim 1, which is produced by the steps consisting essentially of placing, on a mold, an effective amount of an electroconductive nonwoven fabric or a prepreg thereof and then an effective amount of a woven fabric or a prepreg thereof; placing thereon a mixture of a reinforcing fiber material and a liquid crosslink-curable resin composition; and subjecting the laminated materials to compression molding.

8. The molded article according to claim 1, in which the fiber material reinforced resin substrate layer is a short fiber reinforced resin layer having thickness of about 1 to about 10 mm.

9. A process for producing a molded article, having a reflective surface for electromagnetic waves, comprising a electroconductive nonwoven fabric-resin surface layer, a woven fabric-resin intermediate layer adjacent said surface layer and a fiber material reinforced resin substrate layer, and having the properties of uniformly reflecting and shielding electromagnetic waves in the range of VHF to EHF; which process comprises placing, on a mold having a desired molding surface, an effective amount of an electroconductive nonwoven fabric and then an effective amount of a woven fabric for the intermediate layer, placing thereon a mixture of a reinforcing fiber material and a liquid crosslink-curable resin composition for the substrate layer, the compound viscosity of the liquid resin composition being not more than about $5 \times 10^8$ cps; and then compressing the laminated materials under a molding pressure of about 25 to about 100 kgf/cm$^2$ and at a mold closing speed of not more than about 240 mm/minute and curing the resin composition.

10. The process according to claim 9, in which the resulting electroconductive nonwoven fabric-cured resin layer has molded thickness of at least about 0.005 mm, the woven fabric of the intermediate layer has a mesh size of not larger than about 5 mesh, and the resulting woven fabric-cured resin layer has molded thickness of at least about 0.005 mm.

11. The process according to claim 9, in which the fiber of the nonwoven fabric is selected from the group consisting of a metal fiber, a carbon fiber, a metal-coated fiber, an electroconductive synthetic fiber, and mixtures thereof.

12. The process according to claim 9, in which the liquid crosslink-curable resin composition contains a thermoplastic resin used as an antishrinkage agent.

13. The process according to claim 9, in which a sheet molding compound is used for the substrate layer.

14. The process according to claim 9, in which a resin surfacing agent for a thin top layer is applied onto the mold prior to placing the laminated materials on the mold.

15. The molded article according to claim 1, in which the thickness of the nonwoven fabric composite layer is in the range of about 0.005 mm to about 1 mm.

16. The process according to claim 10, in which the thickness of the nonwoven fabric-cured resin layer is in the range of about 0.005 mm to about 1 mm.

17. A fiber reinforced resin molded article for electromagnetic waves having the properties of uniformly reflecting and shielding electromagnetic waves in the range of VHF to EHF, which comprises a compression-molded crosslink-cured laminated structure, having a plane or curved reflective surface, consisting essentially of a surface layer, an intermediate layer and a substrate layer; said surface layer being an electroconductive non-woven fabric-cured resin composite layer having an effective layer thickness of at least about 0.005 mm; said intermediate layer being a woven fabric-cured resin composite layer having an effective layer thickness of at least about 0.005 mm, said woven fabric having a mesh size of not larger than about 5 mesh; and said substrate layer being a fiber material reinforced resin layer, made according to the process of claim 10.

18. The process according to claim 9, in which the electroconductive nonwoven fabric is impregnated with a liquid crosslink-curable composition.

19. The process according to claim 9, in which a bulk molding compound is used for the substrate layer.

20. The process according to claim 9, in which the mold has a molding surface of a convex paraboloid of revolution.

21. The molded article according to claim 1, which is an article of uniformly reflecting electromagnetic waves in the range of VHF to EHF.

22. The molded article according to claim 1, in which the electroconductive nonwoven fabric-resin layer has a distinct layer structure on the woven fabric-resin intermediate layer.

* * * * *